United States Patent
Renken et al.

(10) Patent No.: US 6,190,040 B1
(45) Date of Patent: Feb. 20, 2001

(54) APPARATUS FOR SENSING TEMPERATURE ON A SUBSTRATE IN AN INTEGRATED CIRCUIT FABRICATION TOOL

(75) Inventors: Wayne G. Renken, San Jose; Mei H. Sun, Los Altos, both of CA (US)

(73) Assignee: Sensarray Corporation, Santa Clara, CA (US)

(*) Notice: Under 35 U.S.C. 154(b), the term of this patent shall be extended for 0 days.

(21) Appl. No.: 09/307,667

(22) Filed: May 10, 1999

(51) Int. Cl.[7] .................. G01K 7/02; G01J 5/08

(52) U.S. Cl. .................. 374/185; 374/208; 374/133

(58) Field of Search .................. 374/208, 179, 374/183, 185, 133, 128, 126, 131

(56) References Cited

U.S. PATENT DOCUMENTS

| | | | |
|---|---|---|---|
| 4,763,981 | * 8/1988 | Wilkins | 350/96.23 |
| 4,782,819 | * 11/1988 | Adair | 128/6 |
| 5,011,430 | * 4/1991 | Haitmanek | 439/456 |
| 5,041,009 | * 8/1991 | McCleerey | 439/405 |
| 5,052,821 | * 10/1991 | Gisdakis et al. | 374/179 |
| 5,133,674 | * 7/1992 | Albrecht | 439/465 |
| 5,253,318 | * 10/1993 | Sayegh et al. | 385/114 |
| 5,436,494 | 7/1995 | Moslehi | 257/467 |
| 5,626,491 | * 5/1997 | Hasircoglu | 439/459 |
| 5,746,513 | 5/1998 | Renken | 374/179 |
| 5,775,808 | 7/1998 | Pan | 374/161 |
| 5,969,639 | * 10/1999 | Lauf et al. | 340/870.17 |
| 5,987,204 | * 11/1999 | Lee et al. | 385/100 |
| 6,022,142 | * 8/2000 | Hibino | 374/178 |

FOREIGN PATENT DOCUMENTS

00/03216   1/2000   (WO) .

OTHER PUBLICATIONS

SesArray, Thermal Map 2, Advertizement Brochure, 1996.*
SensArray Corporation, Using SensArray Process Probe Temperature Instrumented Wafers, Process Probe 1819 RTD Temperature Range—100° C to +230° C, two sheet Pamphlet.

(List continued on next page.)

*Primary Examiner*—G. Bradley Bennett
*Assistant Examiner*—Gail Verbitsky
(74) *Attorney, Agent, or Firm*—Steven F. Caserza; Flehr Hohbach Test Albritton & Herbert LLP

(57) ABSTRACT

A cable and interconnect design including a substrate containing discrete sensors in a plurality of cavities or a plurality of thin film sensors deposited throughout the substrate surface. The discrete sensors are bonded within each cavity and potted with a potting compound. Each sensor has leads joined to filaments by an interconnect system. Thin film sensor leads on the substrate connect to a signal transmitting cable by the interconnect system. The filaments are coated and converge at a strain relief coupled to the substrate. The cable, having flat and round portions, includes an array of flat signal transmitting cables arranged side by side in the flat portion and stacked one on top of the other in the round portion. Each signal cable contains a plurality of the filaments bonded together. A pair of ribbons extend along the length of the array of cables. The ribbons and array of cables are bonded together with film to form the flat portion. The ribbons are joined to the strain relief, thereby joining the cable to the substrate. A boot is disposed around the cable transition between the flat and round portions. A connector is coupled to the round portion and the filaments are terminated to the connector. Advantages include the interconnect system bonding pads which reduce fabrication time and provide simple connection geometry on the substrate. Integration of the ribbons into the flat portion allows repeated use in a vacuum seal without damaging the cables. Stacked flat cables make identification of the filaments easy and product assembly fast.

33 Claims, 12 Drawing Sheets

OTHER PUBLICATIONS

SensArray Corporation, "Application Note: Calibration of Process Probe RTD Instrumented Wafers—Background," four sheet Pamphlet.

SensArray Corporation, "Using SensArray Process Probe Temperature Instrumented Wafers, Process Probe 1840 with Ceramic Temperature Range 0 ° C to +230° C", two sheet Pamphlet.

SensArray Corporation, "Process Probe 1840 RTD Temperature Instrumented Wafers—Applications," two sheet Pamphlet.

* cited by examiner

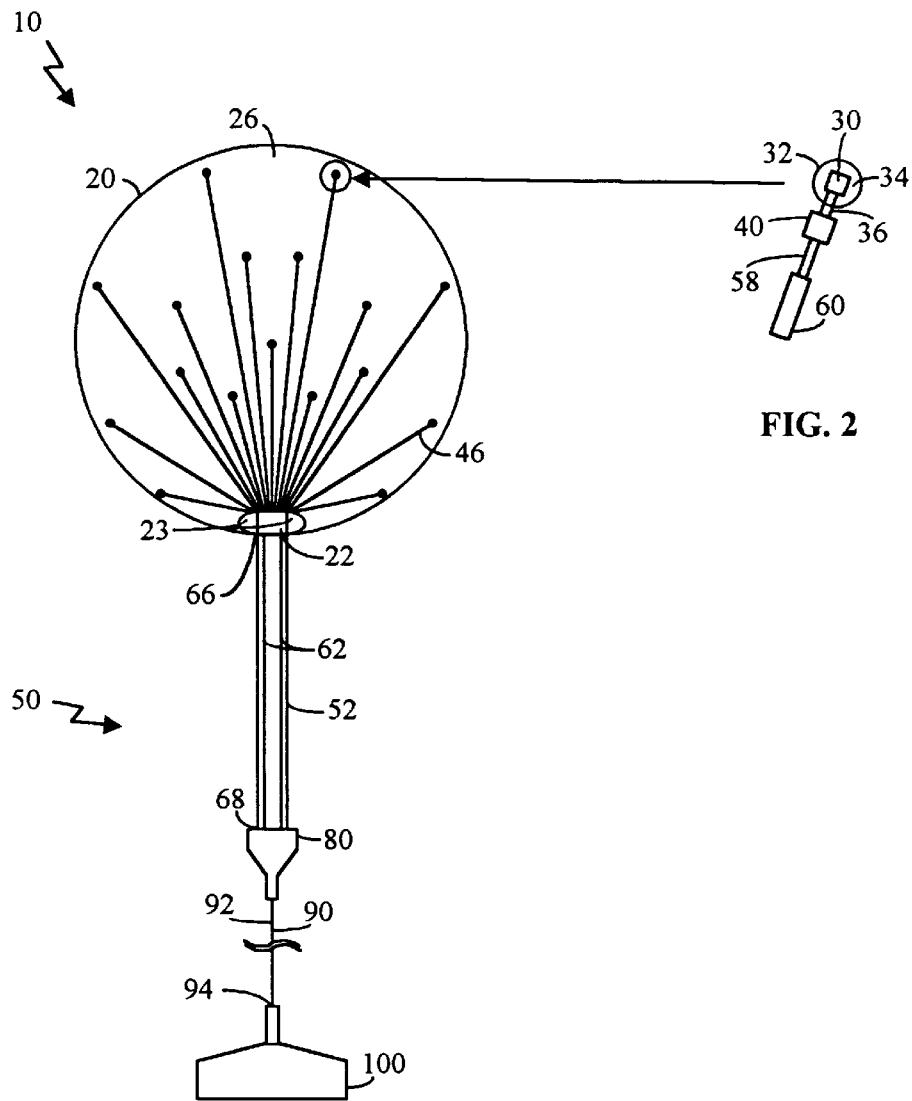
FIG. 2
FIG. 1
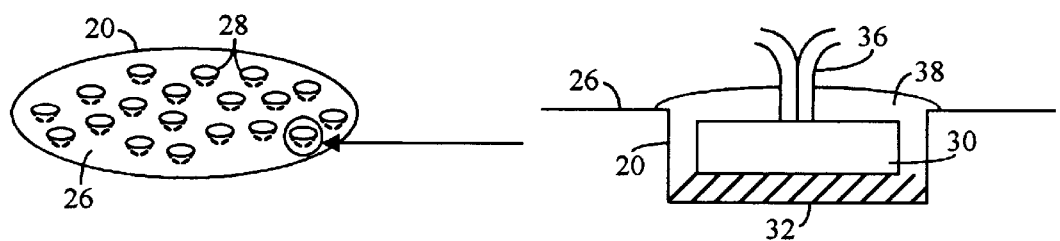
FIG. 3A
FIG. 3B

APPARATUS FOR SENSING TEMPERATURE ON A SUBSTRATE IN AN INTEGRATED CIRCUIT FABRICATION TOOL

FIELD OF INVENTION

The present invention relates to an apparatus for sensing temperature on a substrate in an integrated circuit fabrication tool. In particular, the invention is used for temperature measurement of a substrate instrumented with resistive thermal detectors (RTD), fiber optic sensors or thermocouples CC) under demanding process conditions such as semiconductor wafer and flat panel process.

BACKGROUND OF INVENTION

During the process of manufacturing semiconductor devices, wafer temperature is an important parameter in controlling the physical properties of the material surface structure or film deposition or etching. In fact, control of the wafer temperature and uniformity of the wafer temperature are key parameters for achieving process control and uniformity. Presently, manufacturers of semiconductor devices typically use indirect methods to determine whether the temperature in the chambers is uniform. Direct temperature measurement with an instrumented substrate allows direct temperature control and optimization of temperature uniformity. Therefore, the yield of semiconductor devices can be substantially increased with an apparatus that provides the actual temperature of the regions within the substrate.

Common current practice is to use an indirect temperature measurement method that relies on measuring a temperature related change to the film properties or electrical properties of a test substrate subjected to a process thermal cycle. Since the change in test wafer properties is measured after the process is completed, only a single measurement is available for determining the process thermal history, the peak temperature reached or an indication of a time temperature integral. Moreover, indirect measurement methods require repeated process cycles using a large number of test substrates to characterize or optimize the process cycle. Consequently, since the process thermal cycle may be complex with many different temperature steps, an in-situ continuous measurement of temperature during the complete process cycle is needed.

However, use of direct in-situ temperature measurement systems, which typically employ a pattern of discrete resistive thermal detectors (RTD) or thermocouples (TC) bonded to the top of a test wafer, is limited. The RTD or TC leads of such systems are routed out of the processing chamber through either an electrical connector in a vacuum flange feedthrough, or a flat cable that can be placed under an O-ring seal. Unfortunately, external RTD or TC leads can drain heat from or conduct heat to the measurement junction or the substrate. In addition, the thermal conduction, energy absorption and emissivity properties of the bonding material used to attach the discrete sensors may create a source of error. In fact, the presence of sensor leads can attenuate the energy flowing from the heating source to the wafer, thereby altering the temperature of the wafer. Thus, the presence of sensor leads above a wafer surface can change the temperature of the wafer and provide a distorted temperature reading.

Another problem associated with known in-situ design systems is damage to the conductor wires in a flat cable caused by clamping under processing chamber O-ring flanges. Also, flat cable feedthroughs placed between a compliant O-ring and a flat sealing surface produce a low leak rate through the pressurized or vacuum seal. However, the surface of the film has less compliance than the O-ring and does not completely fill in and block gas leakage along the surface scratches and imperfections of the flange. Consequently, although the leak rate is very low on the side of the flat cable in contact with the O-ring, the leak rate is higher between the flat flange sealing surface and the film surface of the flat cable feedthrough.

Therefore, what is needed is a technique for instrumenting a substrate that maintains uniform surface emissivity and provides precise temperature measurement. In addition, a system is needed for protecting the wire conductors during repeated insertion into the vacuum chamber and from heat in excess of 400° C. The present invention overcomes the problems associated with known systems by disclosing a method and apparatus for sensing temperature on a substrate in an integrated circuit fabrication tool. This results in a system that provides a uniform sensor and interconnect pattern on the wafer with optimized emissivity uniformity. As such, the system is able to determine the actual temperatures in each desired region of the wafer similar to a wafer that is not instrumented at all. Moreover, the flat cable construction allows the cable to be repeatedly placed under a vacuum seal without damaging the internal conductor wires. In addition, the leak rate of the feedthrough along a flat seal surface, under pressure or vacuum, is also significantly reduced. Furthermore, the product design allows quick assembly and easy identification of the sensor conductor wires prior to soldering or crimping to the pins of a PC connector.

Alternatively, thin film metal interconnect conductor lines and thin film RTD or thermocouple sensor elements for measuring process temperature can be directly deposited on a glass substrate or on a dielectric film deposited on a silicon wafer or other conductive substrate. Measuring temperature directly on the substrate surface can reduce many sources of measurement error. Also, simple surface protection of the thin film interconnect and sensor elements enables easier measurement of wet processes. The primary improvement of temperature measurement accuracy in thin film instrumented wafers is due to much higher thermal conduction between the substrate and sensor. The benefit is greatest when measuring substrate temperature in a non-isothermal heating environment.

SUMMARY

The invention overcomes the identified problems by providing an apparatus for sensing temperature on a substrate in an integrated circuit fabrication tool. An exemplary embodiment of the substrate temperature sensing apparatus includes a substrate having a surface containing a plurality of small cavities thereon. A plurality of sensors are each bonded within a corresponding cavity of the substrate with an adhesive, and potted with a potting compound. Each of the sensors has sensor leads protruding through a potting layer formed by the potting compound when it is applied over the cavity containing the sensor and joined to at least one filament or wire by an interconnect system. The filaments or wires are each coated with a wall of insulating material such as polyimide and converge at a strain relief structure which is coupled to a base of the substrate and prevents the filaments from breaking or stretching under tension.

A cable assembly, having a flat cable portion and a round cable portion, is attached to the strain relief structure. The cable assembly includes a parallel array of flat signal transmitting cables arranged side by side. Each of the signal transmitting cables is formed by bonding a plurality of the filaments together side by side with an adhesive. A pair of compression resistant ribbons extend along the length of the array of cables, each on an opposed side thereof. The ribbons and the array of signal transmitting cables are bonded together with two parallel pieces of film or held together by molding them in a thin, compliant continuous sheet to form the flat cable portion having a first end and an opposed second end. The exterior surface of the flat cable film may be coated with a thin compliant layer or coating to reduce the vacuum or pressurized leak rate when clamped against a flat sealing surface. The compliant layer can also be introduced between the flat cable and sealing flanges as a separate sheet of film. The ribbons are fastened to the strain relief at the first end of the flat cable. A protective boot is disposed around the second end of the flat cable portion and provides a transition to the round cable portion. The round cable portion has a first end that is protected by to the boot and contains the stacked signal transmitting cable. The filaments or wires contained within the cable are terminated to a connector at a far end of the round cable portion.

In a discrete sensor embodiment, the interconnect system includes a plurality of thin bonding pads on insulating plates that are coated with an electrically conductive film and attached to the surface of the substrate adjacent to each of the sensors. The sensor leads are joined to a first side of each adjacent bonding pad. The filaments or wires are individually joined to a second side of each of the bonding pads opposite the first side.

In a thin film sensor embodiment, the interconnect system includes a plurality of thin bonding pads on one or more insulation plates that are coated with an electrically conductive film. The insulation plates are mounted on the surface of the substrate near the first end of a flat or interconnect cable adjacent to a cable stress relief clamp. The thin film traces of the sensor leads are terminated with an array of bonding pads located on the measurement substrate adjacent to the insulating plates. The bonding pads on the insulating plates are interconnected to the bonding pads on the thin film sensor substrate with bond wires or bond ribbons. The filaments or wires from the first end of the flat cable are bonded to the opposite ends of the plurality of bond pads on insulating plates. Thereby the array of wires or filaments in the flat cable are individually joined to the leads of the thin film sensors on the measurement substrate.

In another embodiment, the flat cable ribbons are composed of hardened nickel to protect the signal transmitting cables in the flat cable when used under a vacuum seal. The ribbons have the necessary width and thickness to distribute the compression force such that the ribbons will not over-stress in the vacuum seal and are thick enough to prevent compression damage by sealing flanges to the signal transmitting cables. In a further embodiment, the signal transmission cables are stacked at the second end of the flat cable portion, one on top of the other in a specific order as they transition to the stacked array of cables forming a rectangular core in the round cable portion. This organized arrangement allows easy identification of the signal transmitting cables and the filaments within each signal transmitting cable during termination to the connector.

Advantages of the invention include the small size bonding pads used at the substrate and cable interface, which allow the sensor leads to be conveniently and securely connected to the flat cable portion. This reduces the product fabrication time and provides a simple, clean connection geometry on the surface of the substrate. Additional advantages include integration of the two metal ribbons into the flat cable portion. This allows the flat cable portion to be repeatedly used in a vacuum seal without damaging the filaments. Furthermore, the use of stacked signal transmission cables makes the identification of the filaments easy and assembly of the product faster. When the thin film sensors are deposited directly on the substrate surface, higher measurement accuracy is achieved due to superior thermal coupling of the sensors to the substrate and the extremely small thermal mass of the sensors and leads. The flat substrate surface can be encapsulated with protective layer and resist wet chemistry in a wet process. In addition, a uniform distribution of the sensor and the lead patterns provides superior emissivity uniformity. Finally the large number of sensors deposited on the substrate allows easy selection and deselection to achieve the required sensor locations.

BRIEF DESCRIPTION OF THE DRAWINGS

Additional advantages of the invention will become apparent upon reading the following detailed description and upon reference to the drawings, in which:

FIG. 1 depicts an apparatus for sensing temperature on a substrate in an integrated circuit fabrication tool according to a first embodiment of the invention;

FIG. 2 depicts a discrete sensor according to a first embodiment of the invention;

FIG. 3A depicts a substrate containing a plurality of cavities according to first embodiment of the invention;

FIG. 3B depicts a cavity containing a sensor according to a first embodiment of the invention;

DETAILED DESCRIPTION

Figure 4:
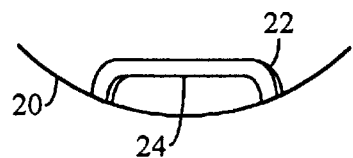
FIG. 4 depicts a strain relief structure according to a first embodiment of the invention.
Figure 5:
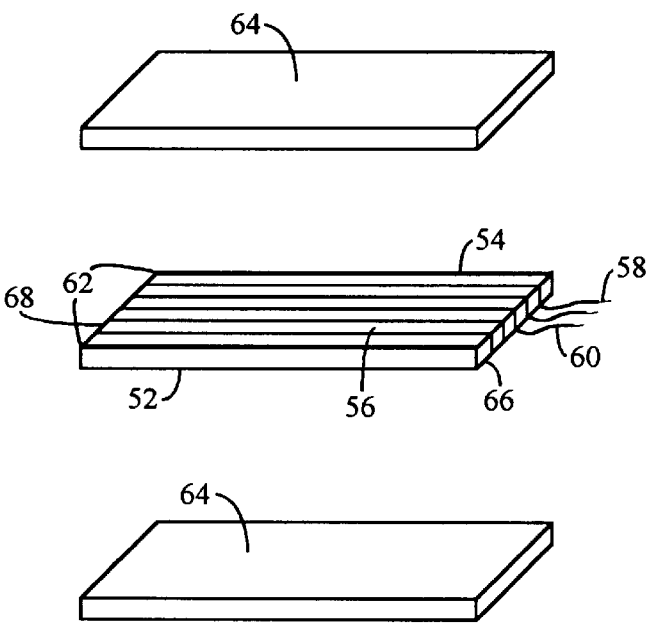
FIG. 5 depicts a flat cable portion according to a first embodiment of the invention.

The present invention relates to an apparatus for sensing temperature on a substrate in an integrated circuit fabrication tool. In particular, the invention relates to an array of planar thin film sensors on a substrate and an integrated flat cable and interconnect for thin film sensors or discrete sensors on a substrate. The invention is used for temperature measurement of a substrate instrumented with resistive thermal detectors (RTD) sensors, fiber optic sensors or thermocouples (TC) under demanding process conditions such as semiconductor wafer and flat panel process.

1. Discrete Sensor Embedded Substrate Embodiment

A first embodiment 10 is described with reference to FIGS. 1 to 5. An apparatus for sensing temperature using discrete sensors on a substrate in an integrated circuit fabrication tool is depicted. The apparatus 10 includes a substrate 20 that has a surface 26 containing a plurality of small cavities 28 thereon. A plurality of sensors 30 are each bonded within a corresponding cavity 28 of the substrate 20 with an adhesive 32 and potted with a potting compound 34. Each of the sensors 30 has sensor leads 36 protruding through a potting layer 38 formed by the potting compound 34 when it is applied over the cavity 28 containing the sensor 30. Each of the sensor leads 36 are joined to at least one filament 58 by an interconnect system 40. The filaments 58 are each coated with a wall of insulating material 60 for mechanical protection and converge at a strain relief structure 22 which is coupled to a base 24 of the substrate 20 and prevents the filaments 58 from stretching or breaking under tension.

A cable assembly 50 having a flat cable portion 52 and a round cable portion 90 is attached to the strain relief structure 22. The cable assembly 50 includes an array of flat signal transmitting cables 54 arranged side by side. Each flat signal transmitting cable 56 is formed by bonding a plurality of the filaments 58 together side by side with an adhesive. A pair of compression limiting ribbons 62 extend along the length of the array of flat signal transmitting cables 54, each on an opposed side thereof. The ribbons 62 and the array of flat signal transmitting cables 54 are bonded together with two pieces of film 64 to form the flat cable portion 52 having a first end 66 and an opposed second end 68. The ribbons 62 are attached to a first side 24 of the strain relief structure 22 at the first end 66 of the flat cable portion 52. A protective boot 80 is disposed over the second end 68 of the flat cable portion 52 and provides a transition to the round cable portion 90. The round cable portion 90 has a first end 92 that is coupled to the boot 80 and contains the filaments 58. A connector 100 is coupled to a second end 94 of the round cable portion 90. The filaments 58 contained within the round cable portion 90 are terminated to the connector 100.

Figure 6:
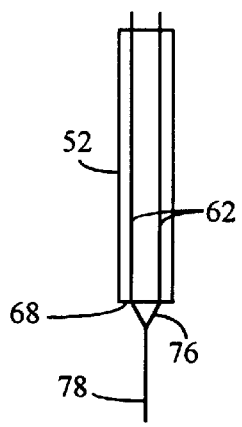
FIG. 6 depicts a Y shaped element and tensile bearing element according to an embodiment of the invention.

Another embodiment of the invention is depicted in FIG. 6, wherein the cable assembly 50 further includes a Y shaped component 76 welded to the ribbons 62 at the second end 68 of the flat cable portion 52. A tensile bearing member 78 is tied to the Y shaped component 76 at the second end 68 of the flat cable portion 52. The tensile bearing member 78 prevents the flat signal transmitting cables 56 from stretching or breaking under tension. In a preferred embodiment, the tensile member 78 is composed of Kevlar filaments. The length of the tensile bearing member 78 is slightly shorter than the length of the flat signal transmitting cables 56 and the modulus of the tensile member 78 is higher than the modulus of the flat signal transmitting cables 56. Alternatively, the tensile bearing member 78 can also be a continuation of the ribbons 62 in the flat cable portion 52.

Figure 7:
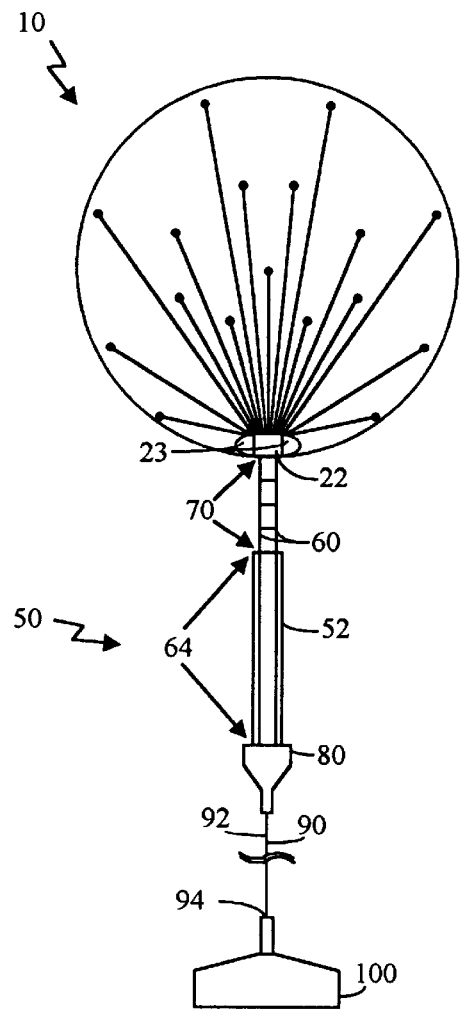
FIG. 7 depicts the an apparatus for sensing temperature on a substrate in an integrated circuit fabrication tool according to another embodiment of the invention.
Figure 8:
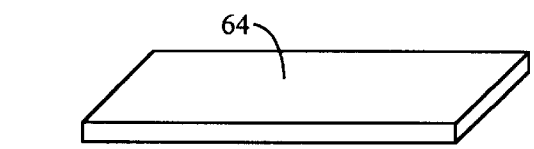
FIG. 8 depicts a flat cable portion according to another embodiment of the invention.
Figure 8:
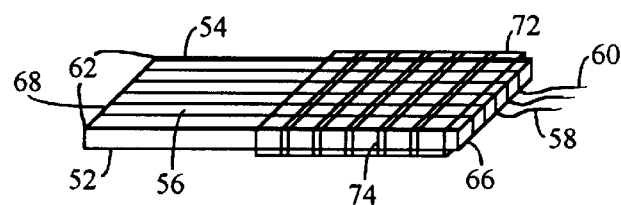
Figure 8:
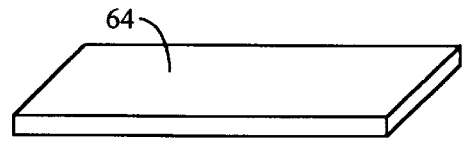

A further embodiment of the invention is depicted in FIGS. 7 and 8, wherein the cable assembly 50 further includes a high temperature resistant region 70 between the substrate 20 and the first end 66 of the flat cable portion 52. This temperature resistant region 70 includes one or more high temperature thin wall flat sleeves 72, each surrounding one or more of the flat signal transmitting cables 56. A plurality of crossbars 74 are placed at predetermined intervals along the high temperature resistant region 70 to hold the region together. In a preferred embodiment, the crossbars 74 are placed ½" apart along the high temperature resistant region 70. This temperature resistant region is able to withstand temperatures in excess of 400° C. The length of the high temperature resistant region 70 is determined by the thermal gradient and the distance from the substrate to an O-ring seal (not shown). Alternatively, the entire length of the flat cable portion 52 can be held together with one or more sheets of tape or film 64 to withstand temperatures of approximately 260° C. such as Kapton tape or film 64.

Figure 9:
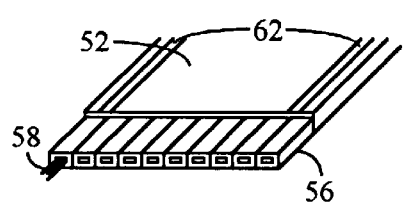
FIG. 9 depicts an array of the flat signal transmitting cables according to another embodiment of the invention.
Figure 10:
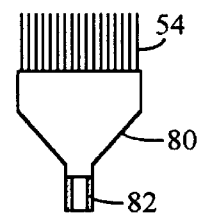
FIG. 10 depicts a stacking of the flat signal transmitting cables at the protective boot according to another embodiment of the invention.

In another embodiment of the invention, depicted in FIGS. 9 and 10, the array of flat signal transmitting cables 54 transition from parallel arrays to stacked arrays as they exit at the second end 68 of the flat cable portion 52. The flat signal transmitting cables 56 are stacked, one on top of the other in a specific order and held together with a cable sleeve 82. The stacked array of flat signal transmitting cables 54 are fed into the protective boot 80 and through the round cable portion 90. The stacking order is maintained along the round cable portion 90 for easy identification of the individual flat signal transmitting cable 56 and the filaments 58 they contain. The filaments 58 are terminated to the connector 100. In a preferred embodiment, the filaments 58 are copper conductor wires. Alternatively, TC wires, optical fibers or a combination of conductor wires and optical fibers can be used as the filaments 58. In addition, the ribbons 62 are composed of hardened nickel to protect the flat signal transmitting cables 56 in the flat cable portion 52 when used in the vacuum seal of a process chamber. The ribbons 62 have a width of 1.0 mm and thickness of 0.13 mm to distribute the compression force such that the ribbons 56 will not over stress the vacuum seal.

Figure 11:
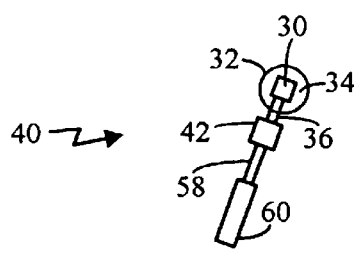
FIG. 11 depicts a sensor according to another embodiment of the invention.
Figure 12:
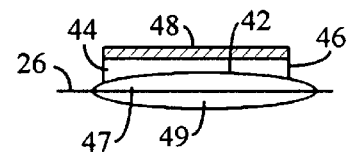
FIG. 12 depicts a bonding pad according to another embodiment of the invention.

In another embodiment depicted in FIGS. 11 and 12, the interconnect system 40 includes a plurality of thin bonding pads 42 that are coated with an electrically conductive film 46 and deposited on thin insulative plates 47. The thin insulative plates 47 that are bonded to the surface 26 of the substrate 20 adjacent to each of the sensors 30 with an adhesive 49. The sensor leads 64 are joined to a first side 44 of each adjacent bonding pad 42. The filaments 58 are individually joined to a second side 46 of one of the bonding pads 42 opposite the first side 42. In an exemplary embodiment, the insulative plates 47 are made of alumina that is able to with stand temperatures in excess of 400° C. and the bonding pads 42 are made of ceramic. In addition, the electrically conductive film 48 on the bonding pads 42 is composed of silver and platinum or molybdenum and manganese. This electrically conductive film 48 facilities signal transmission between the sensor leads 36 and the filaments 58. In addition, the bonding pads 42 are bonded to the substrate surface 26 with an adhesive 49. In an exemplary embodiment, the adhesive 49 is polyimide.

Figure 13:
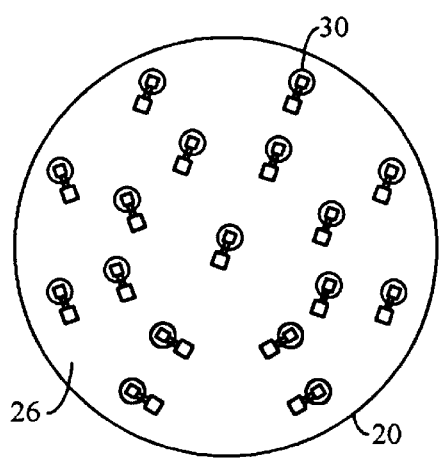
FIG. 13 depicts an axisymmetrical instrumented substrate according to another embodiment of the invention.
Figure 14:
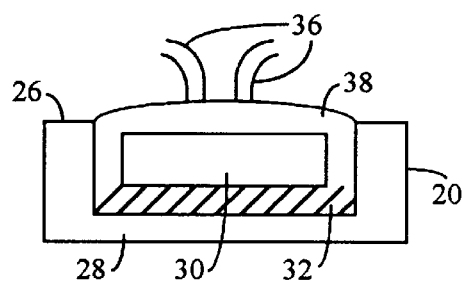
FIG. 14 depicts a cavity containing a sensor according to another embodiment of the invention.

FIGS. 13 and 14 depict the substrate 20 according to another embodiment of the invention. In this embodiment, the substrate 20 is instrumented such that the sensors 30 form an axisymmetric pattern as shown on the substrate 20 to provide uniform density of the pattern on the substrate 20 such that the uniformity of the surface 26 emissivity is optimized. In an exemplary embodiment, the sensors 30 are platinum resistive thermal detectors having a pair of sensor leads 36 welded or bonded to the adjacent bonding pad 42 and bonded to the cavities 28 using a high temperature adhesive such as polyimide adhesive 34 to achieve 400° C. performance. In addition, the filaments 58 are 0.0003 inch copper conductor wires coated with an insulative wall of polyimide, such that; four wires are welded to a second side 46 of each of the bonding pads 42 opposite the first side 44 and soldered to the connector 100. Each signal transmission cable contains 12 conductor wires and for a seventeen 17 RTD assembly, 6 transmission cables would be used to form the cable assembly. The sensors 30 are potted with a good electrically insulating thermal conductor such as silica coated aluminum nitride in a polyimide binder to achieve good thermal coupling between the sensors 30 and the substrate 20. Alternatively, TC or fiber optic sensors may be substituted for the RTDs and used as the sensors 30. In addition, optical fibers, wires or a combination of conductor wires and optical fibers can be used as the filament 58.

Figure 15:
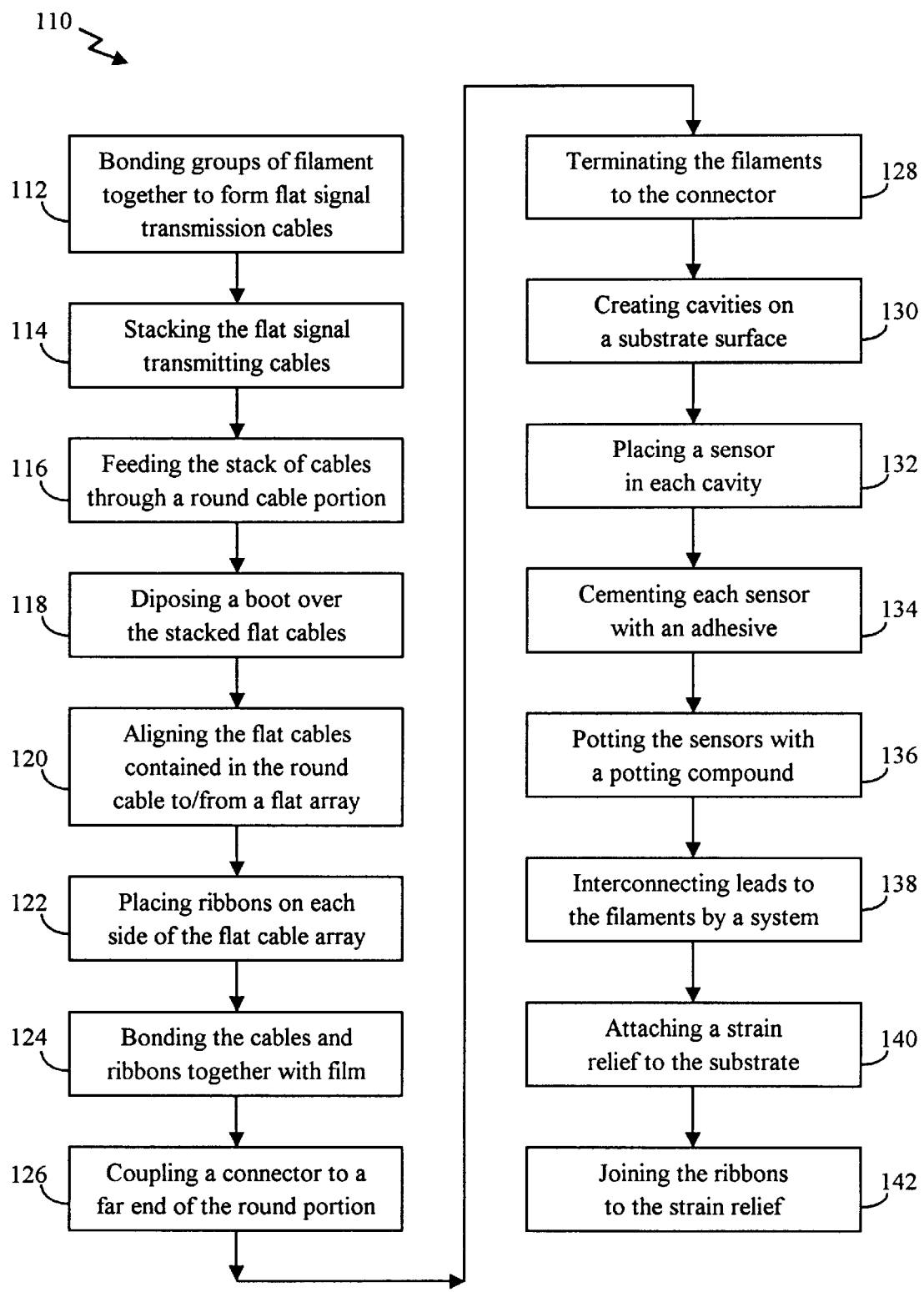
FIG. 15 is a flow chart depicting a process for assembling a cable and interconnect design on a substrate according to another embodiment of the invention.

FIG. 15 depicts a method 110 of forming an apparatus for sensing temperature on a substrate in an integrated circuit fabrication tool, for example, as depicted in FIG. 1. At step 112, groups of filaments 58 are bonded together, side by side, with an adhesive to form a plurality of flat signal transmitting cables 56. At step 114, the signal transmission cables 56 are individually stacked one on top of the other in a specific order for easy identification of the cables 56 and the filaments 58 contained therein. At step 116, the stacked signal transmitting cables 56 are fed through a round cable portion 90 of the cable assembly 50 such that the order is maintained. At step 118, a protective boot 80 is disposed around the stack of flat signal transmission cables 56. At step 120, the plurality of signal transmitting cables 56 are aligned side by side to form an array of flat signal transmitting cables 54. At step 122, a ribbon 62 is placed on each side of the array of flat signal transmitting cables 54. At step 124, the array of flat signal transmitting cables 54 and the ribbons 62 are bonded together with two pieces of film 64 to form a flat cable portion 52 of the cable assembly 50 having a first end 66 and an opposed second end 68. At step 126, a connector 100 is coupled to an end 94 of the round cable portion 90. At step 128, the filaments 58 contained within the flat signal transmitting cables 56 are terminated to the connector 100. At step 130, a plurality of cavities 28 are created in an axisymmetrical shape on a surface 26 of the substrate 20. At step 132, a sensor 30 having sensor leads 36 is deposited within each cavity 28. At step 134, each sensor 30 is cemented within each cavity 28 with an adhesive 32. At step 136, each cavity 28 containing a sensor 30 is potted with a potting compound 34. At step 138, each sensor lead 36 is joined to at least one coated filament 58 by an interconnect system 40. At step 140, a strain relief structure 22 is attached to a base 24 of the substrate 20 where all of the filaments converge. Finally, at step 142, the ribbons 62 contained within the cable assembly 50 are attached to a first side 24 of the strain relief structure 22 at the first end 66 of the flat cable portion 52, thereby securing the cable assembly 50 to the substrate 20.

Figure 16:
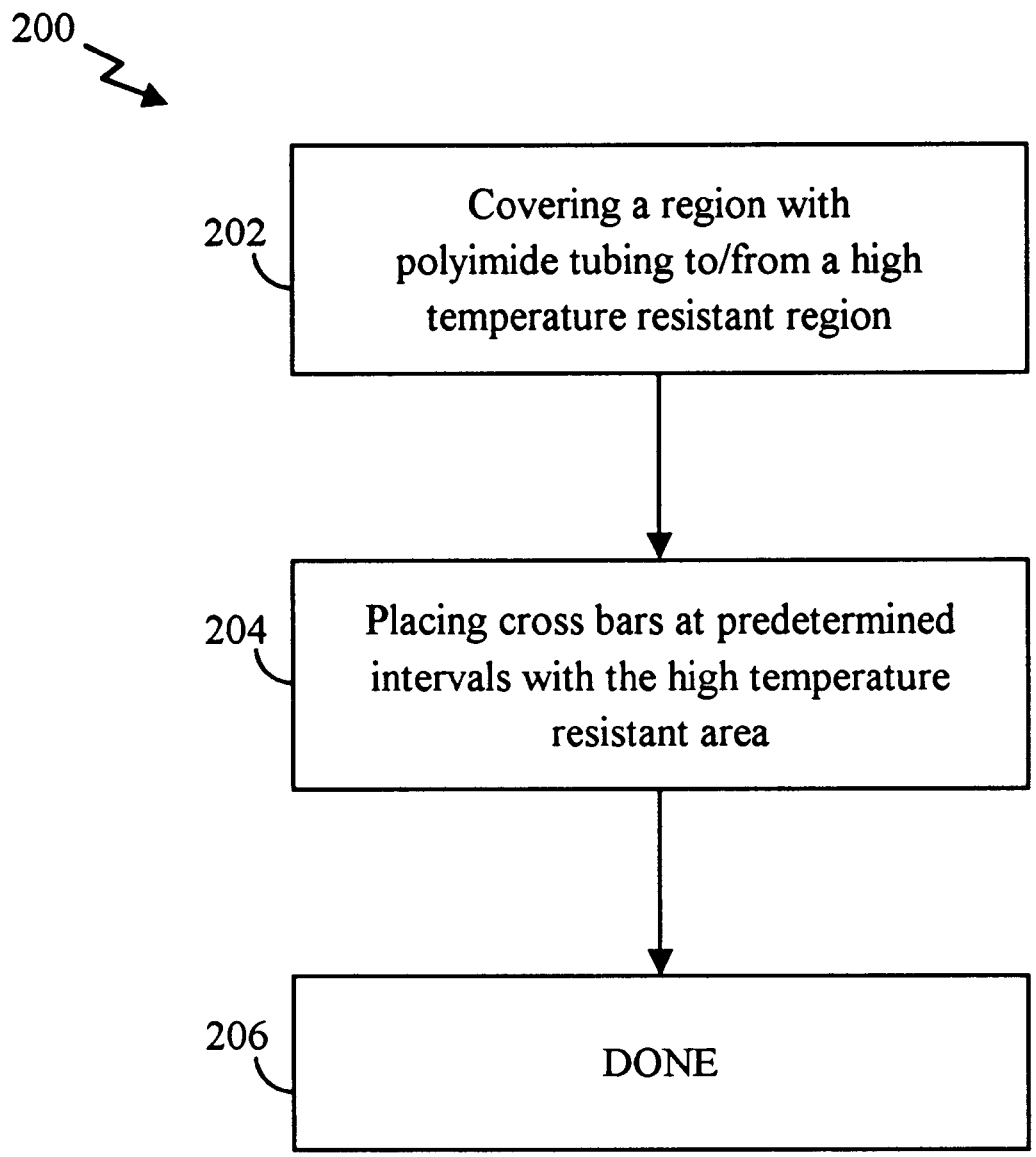
FIG. 16 is a flow chart depicting a process for assembling a high temperature resistant area on the flat cable portion according to another embodiment of the invention.

FIG. 16 depicts additional method steps 200 of forming an apparatus for sensing temperature on a substrate in an integrated circuit fabrication tool, for example, as depicted in FIGS. 7 and 8. At step 202, an area 70 near the first end 66 of the flat cable portion 52 is covered with polyimide sleeving 72 to form a high temperature resistant region 70. Finally, at step 204, a plurality of crossbars 74 are placed at predetermined intervals within the temperature resistant area 70.

Further aspects of the invention include the flat cable portion 52 or the round cable portion 90 which can be formed to a predetermined shape and returns to that shape each time tension used to stretch the cable 50 is released. In another aspect of the invention the strain relief structure 22 is stainless steel and can be joined to the substrate 20 by a pair of rivets 23 instrumented into the substrate. The strain relief structure 22 can also be made of the same material as the substrate 20 and bonded to the substrate with an adhesive. In addition, the stress relief structure 22 stores excess filaments for rework or repair if and when damage occurs to the filaments.

2. Thin Film Interconnection Leads and Sensors Directly Deposited on the Substrate Embodiment Alternatively, thin film metal interconnection leads conductor lines and thin film RTD or thermocouple sensor elements, for measuring process temperature, can be directly deposited on a glass substrate or on a dielectric film deposited on a silicon wafer or other semi-conductive substrate. Forming temperature sensors directly on the substrate surface can reduce many sources of measurement error. Also, simple surface protection of the thin film interconnection leads and sensor elements enables easier measurement in a wet process. One important improvement of temperature measurement accuracy in thin film instrumented wafers is due to superior thermal coupling between the substrate and sensor and a much smaller mass of the sensors and leads. The benefit is especially pronounced when measuring substrate temperature in a non-isothermal heating environment.

An exemplary embodiment 300 is described with reference to FIGS. 17 and 18. An apparatus for sensing temperature on a substrate in an integrated circuit fabrication tool is depicted. The apparatus 300 includes a substrate 310 having a surface 312. A plurality of interconnect conductor lines 314 are deposited and patterned onto the surface 312 of the substrate 310 with a metal film 316. Care should be taken in the layout of the conductor lines 314 to provide uniform infrared absorption and emittance of the substrate 310. The affect of the layout of the conductor lines 314 on the substrate 310 temperature will be highest at elevated temperatures or under vacuum environments. Therefore, the conductor lines 314 should be laid out in a pattern that is of uniform density and symmetrical over the entire substrate surface 312. For example, the area of uniform density should be over an area no greater than a few millimeters. An array of lead bonding pads 311 is deposited at an edge 320 of the substrate and connected to the conductor lines 314. A plurality of thin film sensors 322 having sensor leads 324 are deposited and patterned onto the surface 312 of the substrate 310 with a metal film 316. The sensor leads 324 are connected to the conductor lines 314 in the deposited pattern. The lines 314 all merge in one or more deposited thin film lead bonding pads 311 near the edge of the wafer 320. The deposited bonding pads 311 and an array of discrete bonding pads 318 attached to the substrate adjacent to the deposited bonding pads 311, are connected via bond wires or ribbons, thereby providing an interconnection path 326 between the sensors 322 and the discrete bonding pads 318. The interconnection path 326 is used to help stress relieve the deposited thin film lead bonding pads 311 when the cable 50 is joined to the wafer 310.

In a preferred embodiment, the sensor patterns 322 should be of limited area to measure the local temperature of small areas of the substrate 310 when heated by small area beam energy sources. Sensor areas 322 less than 1 mm are preferred to provide adequate spatial resolution for process measurement and optimization, especially near the substrate edge 320. RTD sensors are usually of a single thin film conductor material formed into a thin line meander resistor patterns that are preferably rectangular, narrow and oriented with their larger dimension parallel to the substrate edge 320. For very small diameter beam energy sources, sensor areas 322 may need to be limited to less than a few microns in area and be distributed in the direction of the beam path of travel. Typical 300 mm round silicon substrates may have up to 34 or more active sensors 322 distributed over the top surface 312 in varying locations. The locations are somewhat dependent on the contour of the thermal non-uniformity expected in the equipment and process to be measured.

In addition, multiple sensors 322 may be connected to a single set of interconnect lines 314. This allows optional locations to be selected by deactivating or disconnecting the unneeded sensors 322. Sensors 322 may be screened so that non-functioning sensors 322 are deactivated, thereby improving yield of instrumented wafer production.

Figure 19:
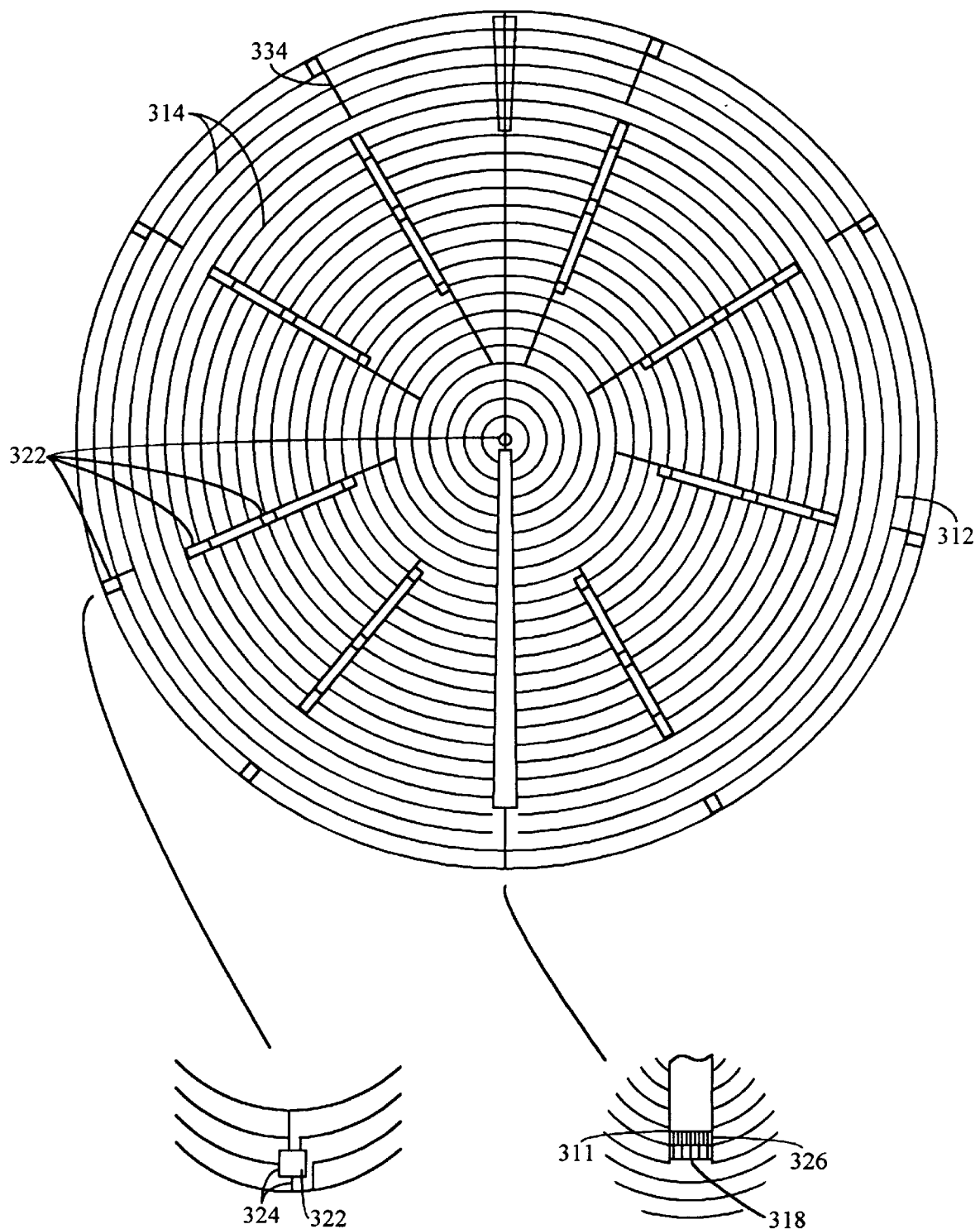
FIG. 19 depicts a circular substrate according to another embodiment of the invention.

In another embodiment depicted in FIG. 19, the substrate is circular. In addition, the conductor lines 314 are formed as symmetrical and uniform concentric circles 330 with spokes 332 radiating outward toward the edge 320 of the substrate 310, thereby interconnecting the concentric circles 330 of conductor lines 314. The conductor lines 314 intersect at a plurality of conductor junctions 334 wherein the sensors 322 are deposited. The concentric circles 330 are separated into isolated segments by minute breaks in the conductor lines 314. The Spokes 332 can be isolated by minute breaks at either end or within the spoke. Spokes 332 without breaks can interconnect the circular segments 330. Sensors 322 can be placed between concentric circles 330, between the spokes 332 or in break areas within the concentric circles or spoke lines 332. The conductors lines 314 can then provide interconnect paths 326 from each sensor location 322 via lead bonding pads 311 to an array of discrete lead bonding pads 318 in one or more areas usually near the edge 320 of the substrate 310. Bonding pads 318 in one area near the edge of the substrate is preferred.

Figure 20:
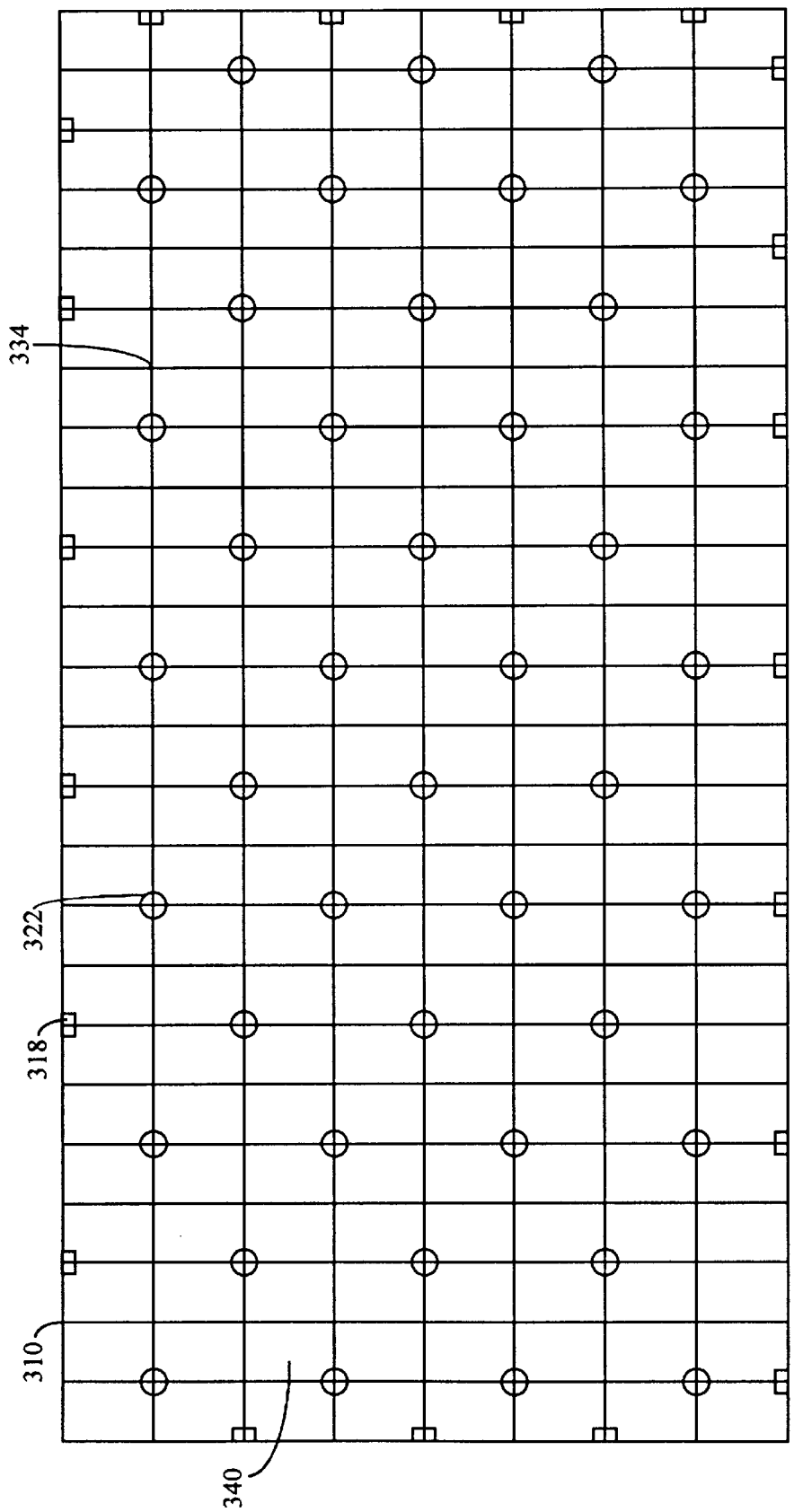
FIG. 20 depicts a rectangular substrate according to another embodiment of the invention.

In another embodiment depicted in FIG. 20, the substrate 310 is rectangular. The conductor lines 314 are formed in symmetrical and uniform rectangular grid shaped pattern 340. The conductor lines 314 intersect at a plurality of conductor junctions 334 wherein the sensors 322 are deposited. Rectangular substrates 310 may best use a rectangular grid shaped interconnect patterns 340. A section of the grid 340 can be isolated with conductor line 314 breaks. The sensors can be placed in the grid 340 openings or within the line breaks 314.

In a further embodiment, the sensors 322 are resistive thermal detectors RTD and interconnected to three or more of the conductor lines 314. The lead resistance of RTD sensor 322 interconnections should be controlled to a value much lower than the sensing element resistance or it will significantly increase the current sources compliance voltage requirements of the RTD measurement circuit 322 and may exceed its operating limit. Sensor resistance measurement 322 using three wire 314 interconnection and compensation in the measurement instrumentation can reduce the influence of lead resistance change with substrate heating. A four wire Kelvin interconnection to each RTD sensor element 322 eliminates the lead resistance influence from the measurement and is preferred.

In another embodiment, the sensors 322 are thermocouples (TC) and interconnected to two or more of the conductor lines 314. Thermocouple sensor patterns are usually a small rectangular area of contact where the first type of TC conductor overlays the second type of TC conductor. Thin film thermocouple leads 324 can be formed into the concentric circle 330 and grid patterns 340 to provide uniform absorption and emittance properties over the substrate 310. TCs 322 can be formed with two isolated sensor leads dedicated to each TC, or multiple TC's can share one common interconnect conductor line 314. TCs 322 can also be arranged to measure in differential mode by forming reference junction 334 regions in one small uniform temperature area on the substrate 310. Actual temperature of the differential TCs 322 can be measured by adding the temperature of the reference junction region 334 on the substrate 310. The reference junction region 334 can be measured with an independent temperature sensor 322.

In a further embodiment, depicted in FIG. 21, the substrate further includes a passivating film 350 which is deposited onto the substrate surface 312 below the interconnect 314 and sensor films 316. The substrate 310 is a conductor in this embodiment; therefore, an insulating film must first be deposited on the substrate surface 312. For example, dielectric films are usually deposited over conductive substrates 310. Such films are formed under the interconnect and sensor films 316 to provide electrical isolation. Silicon substrates 310 can use thermally formed silicon dioxide layers. Silicon and other conductive substrates 310 can be isolated with physical vapor deposition or chemical vapor deposition dielectric films 350 such as silicon dioxide, silicon nitride, aluminum oxide and others. The films 350 should be free of pinholes and contamination to limit leakage currents through the conductive substrate. Passivation films 350 can be physical vapor deposited or chemical vapor deposited dielectric films such as silicon dioxide, silicon nitride, aluminum oxide and others.

Alternatively, a passivation film 350 may be formed over the patterned interconnect 314 and sensor elements 322. This passivating film 350 provides scratch protection and reduces or eliminates leakage currents between conductors lines 314 if the surface 312 becomes contaminated. Passivation films can be physical vapor deposited or chemical vapor deposited dielectric films such as silicon dioxide, silicon nitride, aluminum oxide and others. Passivation films 350 are usually patterned to open the bond pads allowing contact by the external lead system 318 to the sensor interconnect films 314.

Figure 21:
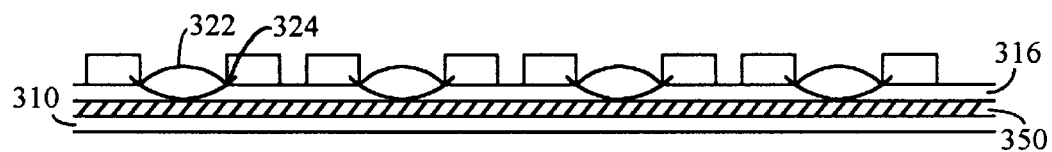
FIG. 21 depicts a cross-section of the substrate according to another embodiment of the invention.
Figure 22:
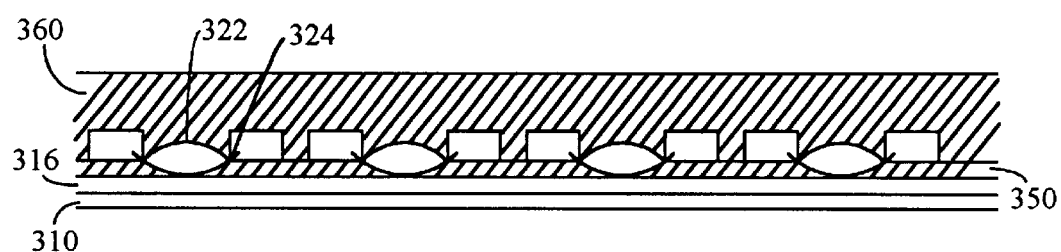
FIG. 22 depicts a cross-section of the substrate according to a further embodiment of the invention.

In another embodiment depicted in FIG. 21, the thin film instrumented substrate includes a protective coating 360 encapsulating the substrate surface thereby allowing the instrumented thin film substrate 310 to be used in wet processes. Thin film instrumented substrates 310 may be used in contact with wet process fluids if a protective coating 360 encapsulates the substrate surface 312 including connections 314 from the substrate 310 to the external lead system 318. Encapsulation coatings include materials such as paralyne which can be deposited by chemical vapor deposition (CVD) and polyimides which can be dip or spray coated.

Figure 17:
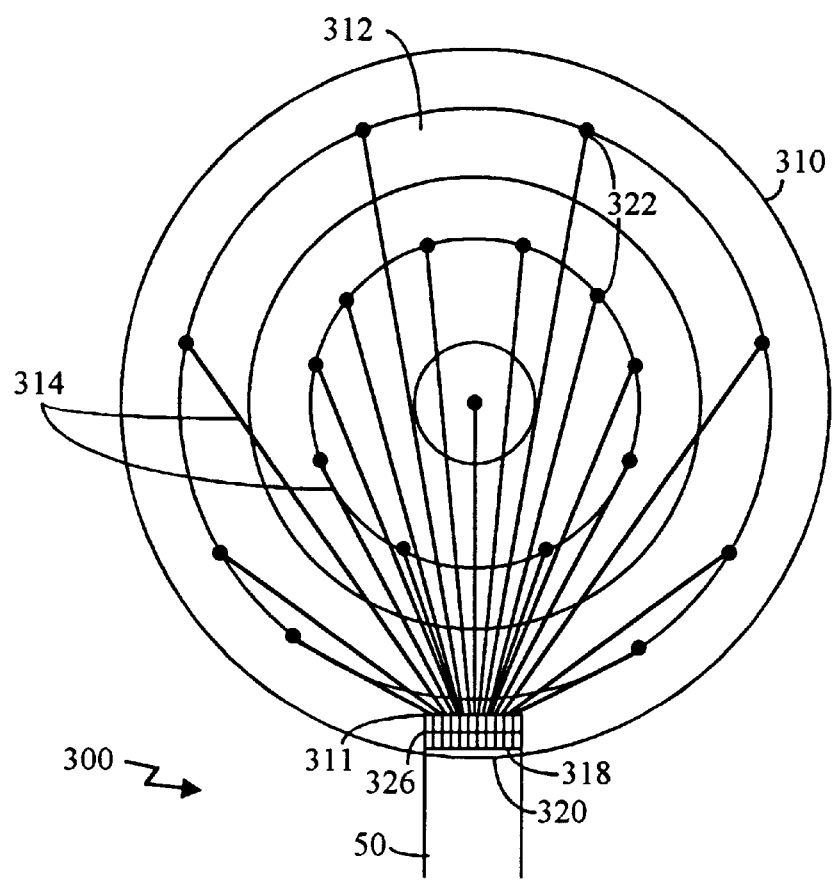
FIG. 17 depicts a thin film temperature sensing apparatus according to an exemplary embodiment of the invention.
Figure 18:
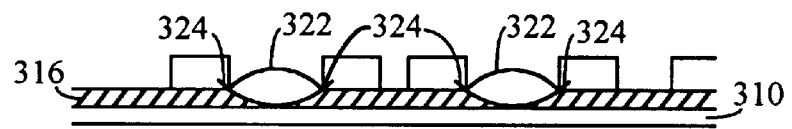
FIG. 18 depicts a cross-section of the substrate according to the exemplary embodiment of the invention.
Figure 23:
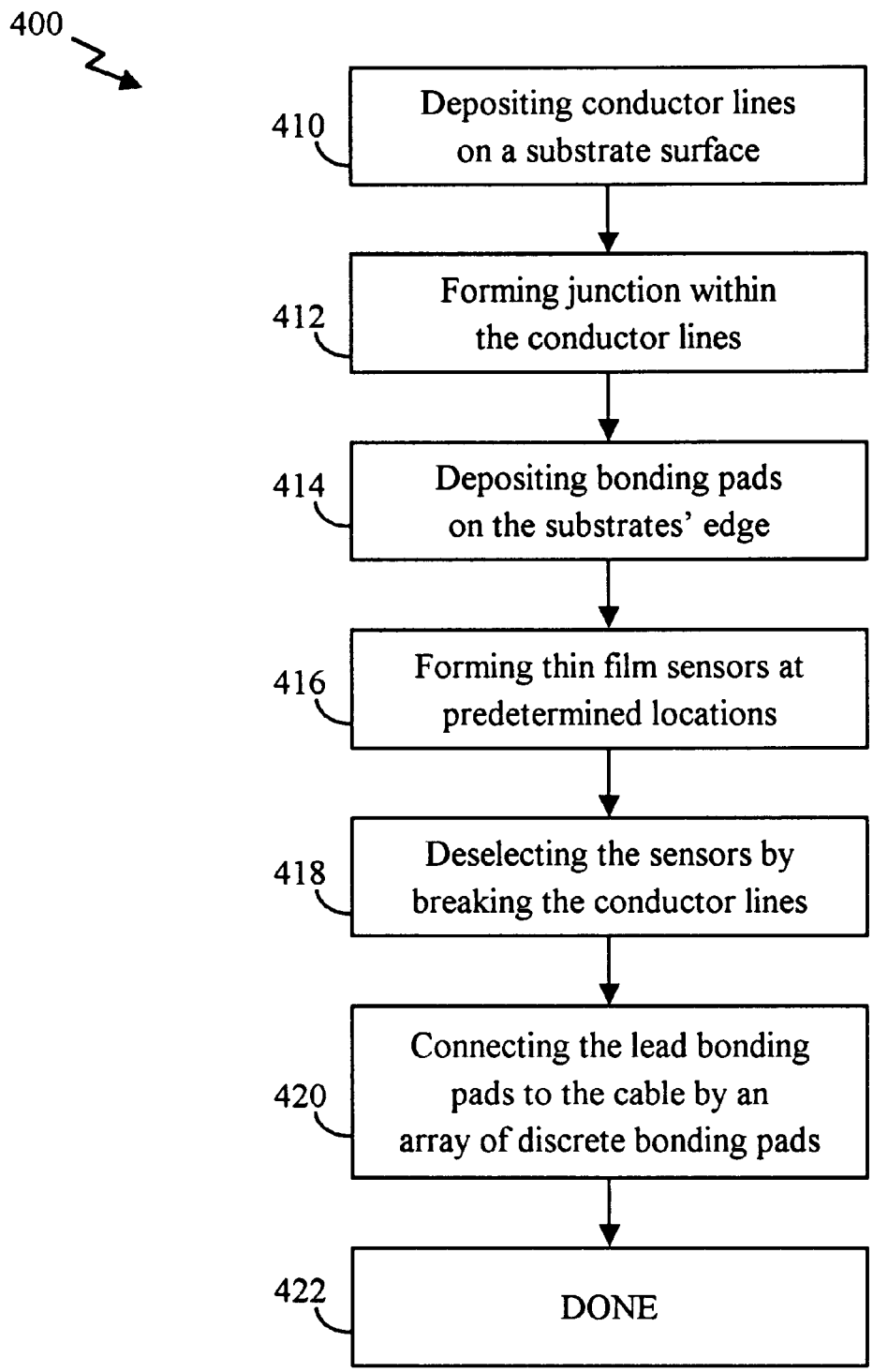
FIG. 23 is a flow chart depicting a process for instrumenting the substrate according to the exemplary embodiment of the invention.
Figure 24:
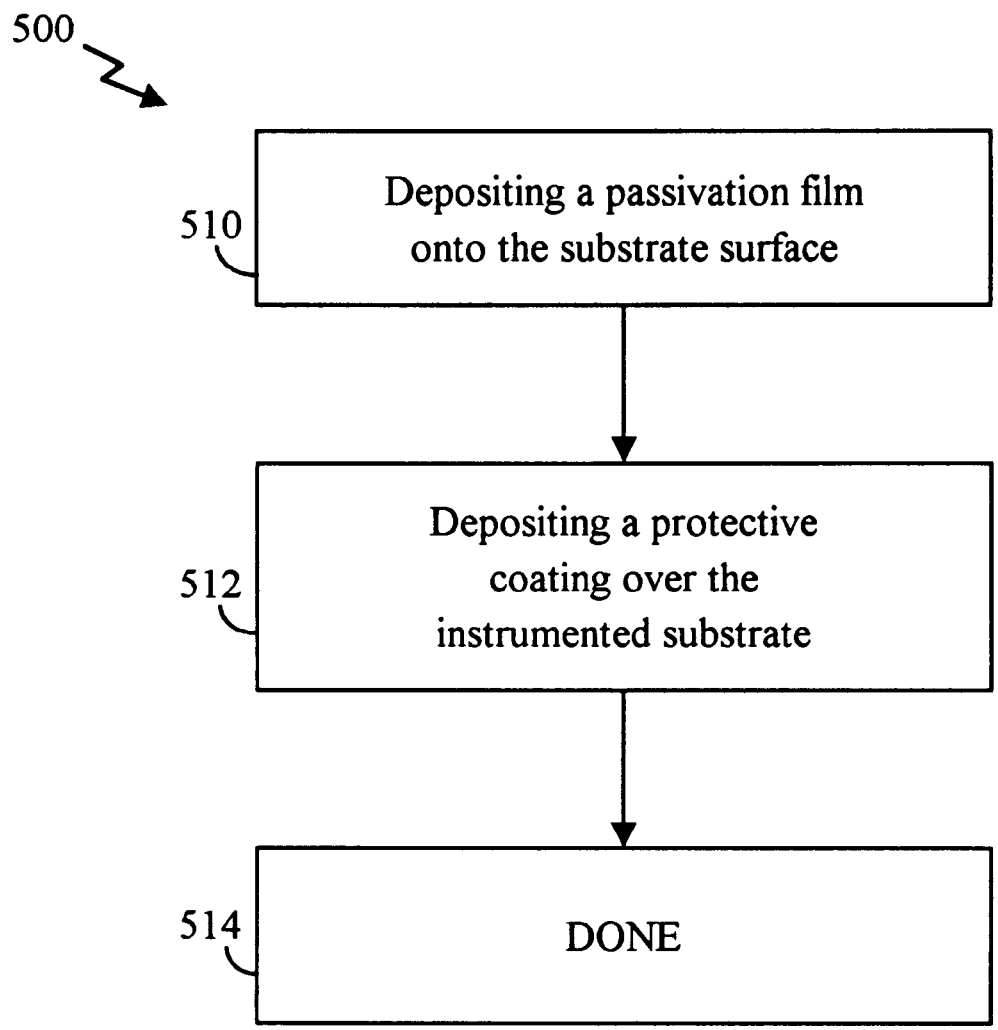
FIG. 24 is a flow chart depicting a process for placing a passivation layer on the substrate according to another embodiment of the invention.

FIG. 23 depicts a method 400 of forming an apparatus for sensing temperature on a substrate in an integrated circuit fabrication tool, for example, as depicted in FIG. 17. At step 410, a plurality of interconnect conductor lines 314 are patterned and deposited onto a substrate surface 312 with metal film(s) 316. At step 412, conductor junctions 328 are formed within the interconnect conductor lines 314. At step 414, an array of lead bonding pads 311 is deposited near an edge 320 of the substrate 310. At step 416, a plurality of thin film sensors 322 having sensor leads 324 are formed on the surface 312 of the substrate 310 with a metal film 316. At step 418, some sensor leads 324 are broken for sensor deselection. At step 420 the sensor leads of each unwanted sensor 322 are deselected from the conductor lines 314, thereby providing an interconnection path 326 only between the selected sensors 322 and the bonding pads 318. The sequence of forming the sensors 322, leads 324, and lead bonding pads 311 shown in FIG. 23 is not required.

The sensor 322 and interconnect lines 314 may be formed from the same or from different metals. Potential metals include aluminum, platinum, copper, nickel, and tantalum, as well as other metallic elements, alloys and mixtures. Some metals may require an adhesion promoting film over the dielectric surface 350 on the substrate 310. For example, if platinum or other noble metals are used as an interconnect or sensor resistor metal, they will be more adherent to a silicon dioxide ($SiO_2$) dielectric or glass substrate if an adhesion promoting metal layer is deposited directly on the oxide surface and underlying the sensor metal film. The adhesion promotion metal layer should have limited diffusion rate at high temperature into the sensor metal layer to prevent metal resistivity change or resistance versus temperature change. Chromium and titanium are potential adhesion promoting materials for noble metal sensor resistor elements.

All metal and dielectric films may be patterned using a photolithographic process or using a photosensitive photo resist process. Patterning of metal films may be by a lift-off processes, wet etch, plasma etch, or ion milling. Some etch processes may require thick resist layers to tolerate erosion during patterning. Other patterning processes may require a hard mask such as a CVD oxide or nitride dielectric film which is first patterned with a photoresist mask, and then is used to protect the sensor and interconnect metal during an etch patterning process which would damage a photoresist film. Dielectric films can be patterned by wet etch, plasma etch, or ion milling processes.

3. Conclusion

Exemplary embodiments have been described with reference to specific configurations. Those skilled in the art will appreciate that various changes and modifications can be made while remaining within the scope of the claims. For example, in one of the preferred embodiments of the invention, the substrate is a silicon wafer instrumented with RTD sensors and adjacent ceramic bonding pads forming an axisymmetrical pattern. Those skilled in the art will appreciate that alternative substrate instrumented with some sensing device and an adjacent interconnect system in a modified pattern remains may come within the scope of the claims. In addition, various configurations of the flat cable assemble are possibly while still remaining within the scope of the claims. For example, bonding of the array of signal transmitting cables is not limited to Kapton film or tape. Moreover, any conductor or optical fiber can be contained within the signal transmitting cables. Likewise, any metal or compression limiting material can be used for the ribbons while still remaining within the scope of the claims.

The invention provides many advantages over known techniques. The present invention includes small size bonding pads used at the substrate and cable interface, which allow the sensor leads to be conveniently and securely connected to the cable. This reduces the product fabrication time and provides simple, clean connection geometry on the surface of the substrate. In addition, the invention includes the integration of the two metal ribbons into the flat cable construction. This allows the flat cable construction to be repeatedly used in a vacuum seal without damaging the signal transmission cables. Furthermore, the invention employs stacking of the signal transmission cables which makes identification of the filaments easy and assembly of the product faster.

All publications and patent applications mentioned in this specification are herein incorporated by reference to the same extent as if each individual publication or patent application was specifically and individually indicated to be incorporated by reference.

The invention now being fully described and having disclosed exemplary embodiments and best mode, it will be apparent to one of ordinary skill in the art that many changes and modifications can be made thereto without departing from the spirit or scope of the appended claims.

What is claimed is:

1. An apparatus for sensing temperature on a substrate in an integrated circuit fabrication tool, comprising:
    a substrate having a surface containing a plurality of small cavities thereon;
    a plurality of sensors each bonded within a corresponding cavity of said substrate with an adhesive and potted with a potting compound, each of said sensors having sensor leads protruding through a potting layer formed by said potting compound;
    an interconnect system joining at least one filament to each of said sensor leads, each of said filaments coated with a wall of insulating material for mechanical protection;
    a strain relief structure coupled to a base of said substrate, said filaments converging at said strain relief structure;
    a cable assembly having a flat cable portion, including:
        (a) an array of flat signal transmitting cables arranged side by side, each of said signal transmitting cables formed by bonding a plurality of said filaments side by side with an adhesive;
        (b) a pair of ribbons extending along the length of said array of signal transmitting cables, each on an opposed side thereof and held together with one or more sheets of film to form said flat cable portion having a first end and an opposed second end, said ribbons welded to a first side of said strain relief at said first end of the flat cable portion; and
        (c) a protective boot disposed around said second end of the flat cable portion, said signal transmitting cables extending therethrough; and
    a connector coupled to an end of the cable assembly and said filaments contained within the cable assembly terminated to said connector.

2. The apparatus of claim 1, wherein said cable assembly further includes:

a Y shaped component welded to the ribbons at the second end of the flat cable portion;

a tensile bearing member tied to the Y shaped component at the second end of the flat cable portion to prevent said signal transmitting cables from stretching under tension; and a round cable portion between the protective boot and the connector, said signal transmitting cables extending therethrough.

3. The apparatus of claim 2, wherein said interconnect system further includes:

a plurality of bonding pads coated with an electrically conductive film and deposited on a thin insulative plate that is bonded to the surface of the substrate adjacent to each of said sensors with an adhesive, said sensor leads joined to a first side of each adjacent bonding pad and said filaments joined to a second side of said bonding pads opposite said first.

4. The apparatus of claim 3, wherein said strain relief structure is bonded to said substrate with an adhesive and stores excess filaments for rework and repair.

5. The apparatus of claim 3, wherein:

said ribbons are composed of hardened nickel to protect the signal transmitting cables in the flat cable portion when used under a vacuum seal and the ribbons have the necessary width and thickness to distribute the compression force such that the ribbons will not over-stress the vacuum seal and the flat cable will not be over-stressed by the vacuum seal;

said signal transmission cables are stacked at said second end of the flat cable portion, one on top of the other in a specific order and held together with a cable sleeve to maintain the order along said round cable portion for easy identification during termination to said connector;

at least one of said flat cable portion and said cable round cable portion is preformed to a specific shape and substantially returns to said shape each time an amount of tension applied to extend the cable is removed; and said strain relief structure joined to said substrate by a pair of rivets instrumented into the substrate and containing excess filaments for rework or repair.

6. The apparatus of claim 5, wherein:

said substrate is instrumented such that said sensors form an axisymmetric pattern on the substrate to provide uniform density of the pattern on the substrate such that the uniformity of the emissivity of the substrate surface is optimized;

said bonding pad bonding adhesive is a polyimide;

said sensor bonding adhesive is a polyimide; and said potting compound is silica coated aluminum nitride in a polyimide binder.

7. The apparatus of claim 6, wherein:

said tensile bearing member is Kevlar thread, a length of the tensile bearing member is slightly shorter than a length of the signal transmitting cables and a modulus of said tensile member is higher than a modulus of the signal transmitting cables; and said adhesive used to bond together said plurality of filaments side by side to form each of said signal transmission cables is a polyimide.

8. The apparatus of claim 7, wherein:

said sensors are platinum resistive thermal detectors having a pair of sensor leads joined to a first side of the adjacent bonding pad;

said filaments are electrically conductive copper wires individually joined to a second side of one of said bonding pads opposite said first side and soldered to said connector; and said wall of insulating material is polyimide.

9. The apparatus of claim 7, wherein:

said sensors are thermocouples having a pair of sensor leads connected to the filaments;

said filaments are thermocouple wires terminated to said connector; and said wall of insulating material is polyimide.

10. The apparatus of claim 7, wherein:

said sensors are fiber optic;

said filaments are optical fibers.

11. The apparatus of claim 1, wherein said cable assembly further includes:

a Y shaped component welded to the ribbons at the second end of the flat cable portion;

a tensile bearing member tied to the Y shaped component at said second end of the flat cable portion to prevent said signal transmitting cable from stretching under tension;

a high temperature resistant area near the first end of the flat cable portion wherein a polyimide tubing surrounds said array of signal transmitting cables which are held together by a plurality of cross bars at said high temperature area of the flat cable portion; and a round cable portion between the protective boot and the connector, said signal transmitting cables extending therethrough.

12. The apparatus of claim 11, wherein said interconnect system further includes:

a plurality of bonding pads coated made with an electrically conductive film and deposited on a thin insulative plate that is bonded to the surface of the substrate adjacent to each of said sensors with said adhesive, said sensor leads joined to a first side of each adjacent bonding pad and said filaments joined to a second side of said bonding pads opposite said first.

13. The apparatus of claim 12, wherein:

said strain relief structure is bonded to said substrate with an adhesive and stores excess filaments for rework and repair.

14. The apparatus of claim 12, wherein:

said ribbons are composed of hardened nickel to protect the signal transmitting cables in the flat cable portion when used under a vacuum seal and the ribbons have the necessary width and thickness to distribute the compression force such that the ribbons will not over-stress the vacuum seal and the flat cable will not be over-stressed by the vacuum seal;

said signal transmission cables are stacked at said second end of the flat cable portion, one on top of the other in a specific order and held together with a cable sleeve to maintain the order along said round cable portion for easy identification during termination to said connector;

at least one of said flat cable portion and said cable round cable portion is preformed to a specific shape and substantially returns to said shape each time an amount of tension applied to extend the cable is removed; and said strain relief structure joined to said substrate by a pair of rivets instrumented into the substrate and containing excess filaments for rework or repair.

15. The apparatus of claim 14, wherein:

said substrate is instrumented such that said sensors form an axisymmetric pattern on the substrate to provide uniform density of the pattern on the substrate such that the uniformity of the emissivity of the substrate surface is optimized;

said bonding pad bonding adhesive is a polyimide;

said sensor bonding adhesive is a polyimide; and said potting compound is silica coated aluminum nitride in a polyimide binder.

16. The apparatus of claim 15, wherein:

said tensile bearing member is Kevlar thread, a length of the tensile bearing member is slightly shorter than a length of the signal transmitting cables and a modulus of said tensile member is higher than a modulus of the signal transmitting cables; and said adhesive used to bond together said plurality of filaments side by side to form each of said signal transmission cables is a polyimide.

17. The apparatus of claim 15, wherein:

said sensors are platinum resistive thermal detectors having a pair of sensor leads joined to a first side of the adjacent bonding pad;

said filaments are electrically conductive copper wires individually joined to a second side of one of said bonding pads opposite said first side and soldered to said connector; and said wall of insulating material is polyimide.

18. The apparatus of claim 15, wherein:

said sensors are thermocouples having a pair of sensor leads being the filaments or connected to the filaments;

said filaments are thermocouple wires terminated to said connector.

19. The apparatus of claim 15, wherein:

said sensors are fiber optic;

said filaments are optical fibers; and said wall of insulating material is polyimide.

20. The method of claim 1, further including the steps of:

(f) depositing a passivation film onto the substrate surface below the sensor and interconnect films; and (g) depositing a protective coating over the instrumented substrate for use in wet processes.

21. A method of forming an apparatus for sensing temperature on a substrate in an integrated circuit fabrication tool, comprising the steps of:

(a) bonding together groups of the filaments side by side with polyimide to form a plurality of flat signal transmitting cables;

(b) stacking the flat signal cables individually one on top of the other in a specific order for easy identification of the filaments;

(c) feeding the stacked cables through a round cable sleeve, with a length of the flat cables protruding the round sleeve;

(d) disposing a protective boot over the cable with the wider end of the boot facing the protruded cables;

(e) aligning the flat signal transmitting cables side by side to form an array of flat signal cables near one end of the round sleeve;

(f) placing a pair of ribbons on each side of the array of flat signal cables;

(g) bonding the array of flat signal cables and ribbons in place with two sheets of film to form a flat cable portion of the cable having a first end and an opposed second end;

(h) coupling a connector to an end of the cable;

(i) terminating the filaments to the connector;

(j) creating a plurality of cavities on a surface of the substrate;

(k) disposing a sensor within each cavity;

(l) cementing each sensor within each cavity with an adhesive;

(m) potting each sensor with a potting compound;

(n) joining each sensor lead to at least one filament by an interconnect system;

(o) attaching a strain relief structure to the substrate; and (p) welding the ribbons to the strain relief at a first end of the flat cable portion.

22. The method of claim 21, further comprising the steps of:

(q) covering the area near the first end of the flat cable portion with a polyimide sleeve to form a high temperature resistant area; and (r) placing a plurality of cross-bars at predetermined intervals within the temperature resistant area.

23. An apparatus for sensing temperature on a substrate in an integrated circuit fabrication tool, comprising:

a substrate having a surface;

a plurality of interconnect conductor lines deposited and patterned onto the surface of said substrate with a metal film, said conductor lines intersecting at a plurality of conductor junctions;

an array of lead bonding pads deposited at an edge of the substrate and connected to said conductor lines;

an array of discrete bonding pads coupled to the substrate adjacent to said lead bonding pads and connected to said lead bonding pads; and a plurality of thin film sensors having sensor leads deposited and patterned onto the surface of said substrate with a metal film, unwanted sensor leads are broken from the conductor lines during a sensor de-selection process, thereby providing an interconnection path only between the selected sensors and the pads.

24. The apparatus of claim 23, wherein:

said substrate is circular;

said conductor lines are formed in concentric circles with spokes radiating outward toward said edge of the substrate, thereby interconnecting said concentric circle conductor lines, said conductor lines intersecting at a plurality of conductor junctions; and said sensors are deposited at selected locations on the substrate.

25. The apparatus of claim 23, wherein:

said substrate is rectangular; and said conductor lines are formed in a rectangular grid shaped pattern, said conductor lines intersecting at a plurality of conductor junctions; and said sensors are deposited at selected locations on the substrate.

26. The apparatus of claim 23, wherein:

said lead bonding pads and said discrete bonding pad are connected by a plurality of bond wires.

27. The apparatus of claim 23, wherein:

said lead bonding pads and said discrete bonding pads are connected by a plurality of ribbons.

28. The apparatus of claim 23, wherein:

said sensors are resistive thermal detectors and interconnected to three or more of said conductor lines.

29. The apparatus of claim 23, wherein:

said sensors are thermocouples and interconnected to two or more of said conductor lines.

30. The apparatus of claim 23, wherein the thin film instrumented substrate includes:

a protective coating encapsulating the substrate surface thereby allowing the instrumented thin film wafer to be used in wet processes.

31. The apparatus of claim 23, wherein said substrate further includes:

a passivating film is deposited onto the substrate surface below the interconnect and sensor films; and said substrate is a semiconductor.

32. The apparatus of claim 23, wherein:

said substrate is glass.

33. A method of forming an apparatus for sensing temperature on a substrate in an integrated circuit fabrication tool, comprising the steps of:

(a) patterning a plurality of interconnect conductor lines onto a substrate surface with a metal film that is symmetrical and uniform;

(b) forming conductor junctions within the interconnect conductor lines;

(c) depositing an array of lead bonding pads along edges of the substrate;

(d) forming a plurality of thin film sensors having sensor leads on the surface of the substrate with a metal film at selected locations on the substrate; and (e) deselecting the sensor leads of each unwanted sensor from the conductor lines, thereby providing an interconnection only path between the selected sensors and the pads.

* * * * *